United States Patent [19]

Szczyrbowski et al.

[11] Patent Number: 4,990,234
[45] Date of Patent: Feb. 5, 1991

[54] PROCESS FOR COATING SUBSTRATES MADE OF A TRANSPARENT MATERIAL, FOR EXAMPLE FLOATGLASS

[75] Inventors: Joachim Szczyrbowski, Goldbach; Stephan Rögels, Rodenbach, both of Fed. Rep. of Germany; Anton Dietrich, Triesen, Liechtenstein; Klaus Hartig, Ronneburg, Fed. Rep. of Germany

[73] Assignee: Leybold Aktiengesellschaft, Hanau, Fed. Rep. of Germany

[21] Appl. No.: 377,531

[22] Filed: Jul. 10, 1989

[30] Foreign Application Priority Data

Mar. 1, 1989 [DE] Fed. Rep. of Germany ....... 3906453

[51] Int. Cl.$^5$ ............................................. C23C 14/34
[52] U.S. Cl. ........................ 204/192.230; 204/192.260
[58] Field of Search ...................... 204/192.22, 192.23, 204/192.26, 192.27

[56] References Cited

U.S. PATENT DOCUMENTS 4,769,291 9/1988 Belkind et al. ..................... 428/630

Primary Examiner—Aaron Weisstuch
Attorney, Agent, or Firm—Felfe & Lynch

[57] ABSTRACT

Process for coating transparent substrates, for example float glass, with a transparent dielectric layer having a low refractive index ($n < 1.7$) at a high layer growth rate ($> 6.0 A\ cm^2/W\ sec$) by means of reactive direct current cathode sputtering. A vacuum chamber includes a cathode 5 which is provided on one of its surfaces with the material (target) to be sputtered and deposited on the substrate 3. The material to be sputtered (target) is a silicide, preferably nickel disilicide ($NiSi_2$), and the layer deposited on the substrate is the corresponding oxide, for example NiSi-oxide. The reactive gas introduced into the vacuum chamber is oxygen and the process gas is a noble gas.

2 Claims, 4 Drawing Sheets

Characteristic curve, cathode voltage as a function of oxygen flow at a constant sputter current for NiSi$_2$ target.

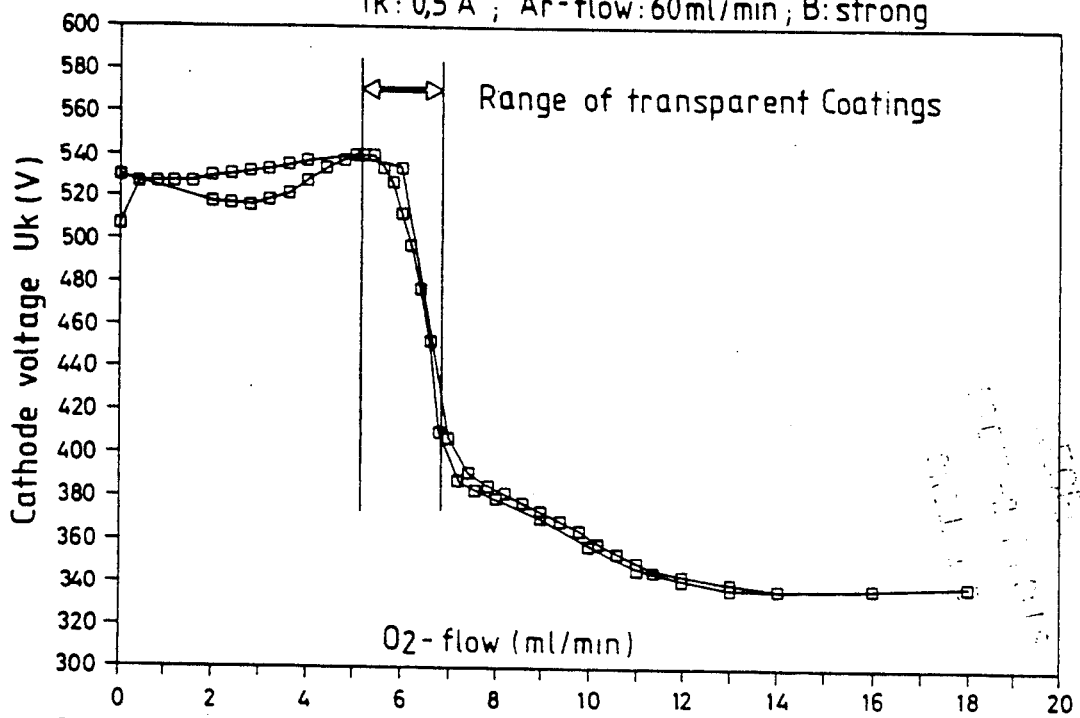
Characteristic curve, cathode voltage as a function of oxygen flow at a constant sputter current for NiSi₂ target.
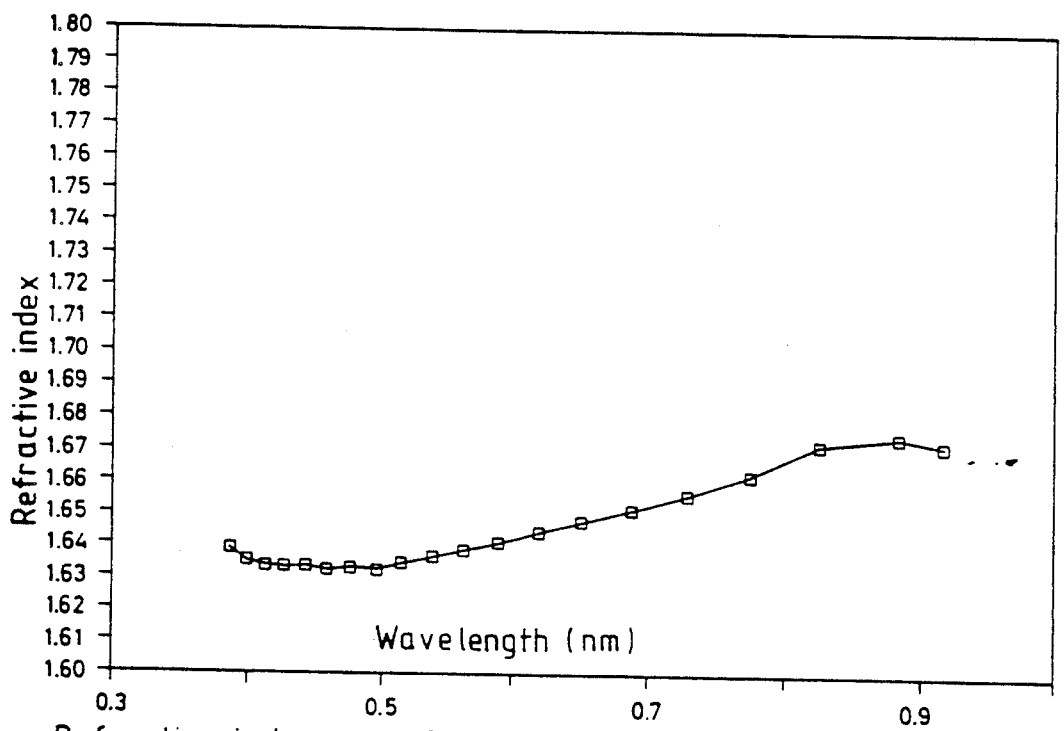
Refractive index as a function of wavelength for the coating of FIG.5

Extinction coefficient as a function of wavelength for the coating of FIG. 5

Comparison of the reactive characteristic lines (voltage as a function of oxygen flow of NiSi2.

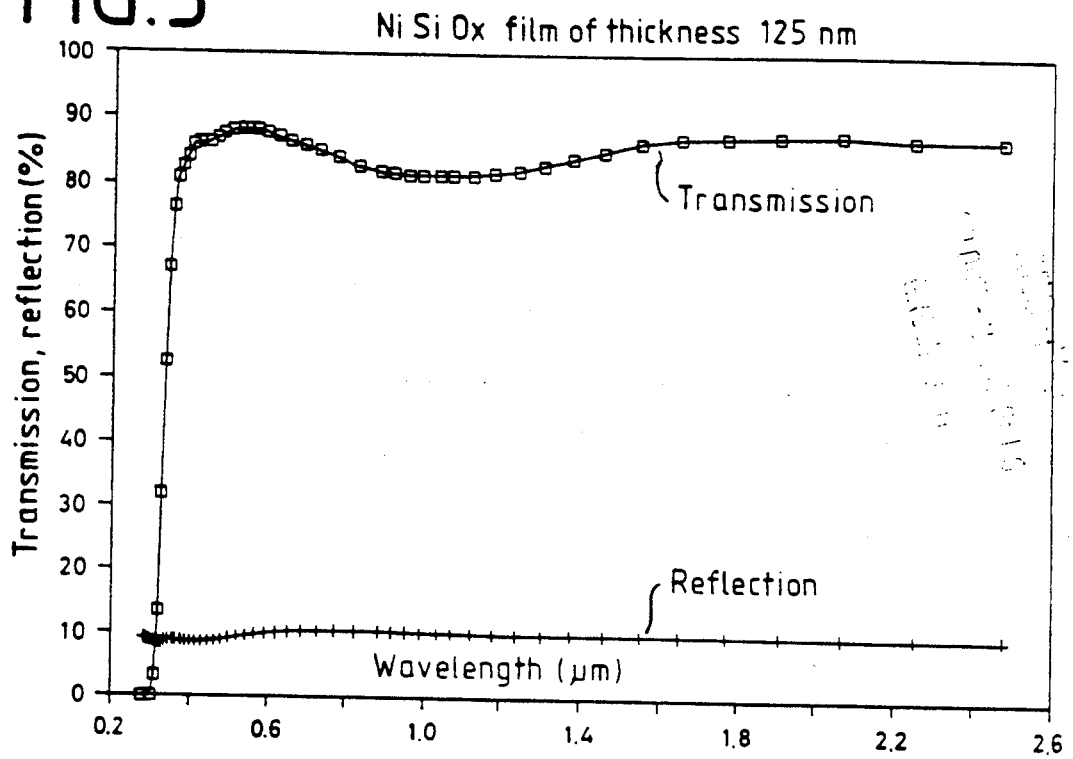
TRANSMISSION AND REFLECTION AS A FUNCTION OF WAVELENGTH OF A SPUTTERED NiSi OXIDE COATING ON 2 MM GLASS.
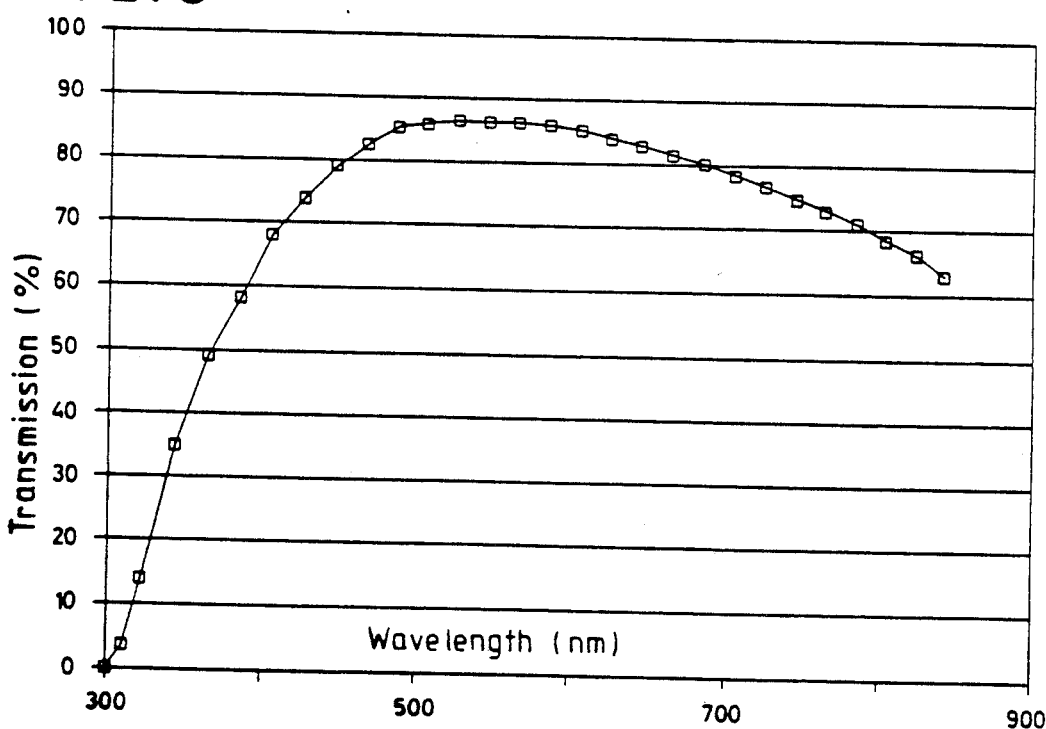
TRANSMISSION AS FUNCTION OF WAVELENGTH OF A LOW E COATING OF A GLASS SUBSTRATE MADE AFTER EXAMPLE 2.

PROCESS FOR COATING SUBSTRATES MADE OF A TRANSPARENT MATERIAL, FOR EXAMPLE FLOATGLASS

BACKGROUND OF THE INVENTION

The invention relates to a process for coating substrates made of a transparent material, for example floatglass, including a transparent, dielectric layer having a low refractive index (n <1.7) at a high rate of layer deposition (>6.0 A cm$^2$/W sec) by means of constant voltage cathode sputtering in a vacuum chamber, including a cathode which is, on one of its surfaces, provided with the material (target) to be sputtered and to be deposited on the substrate.

It is known to deposit thin layers of a chemical compound of a metal with oxygen or nitrogen or other gaseous materials, in the form of oxides or nitrides etc. by means of reactive high-capacity cathode sputtering (magnetron sputtering). In this process a metal containing, especially an electrically conductive material, is used as a target and the desired compound is formed when a part or the entire sputtering atmosphere is replaced by a second gaseous component during sputtering. In the gas discharge the added, reactive gas required for the sputtering process is excited and combined with the sputtered metal of the target such that a chemical reaction between the metal and the admitted gas is effected. This causes the desired compound to be deposited on the substrate and the other surfaces in the area of the gas discharge.

An electrically conductive target is to be preferred to a non-conductive target since the gas discharge can be maintained in the form of a direct current (DC) discharge as opposed to a high-frequency discharge which is to be used for non-conductive targets. The DC-discharge has the advantage that the apparatus required are significantly less complex and, hence, less expensive and it also offers the possibility to build sputtering cathodes having a length of 4 m which permit large-scale uniform coating of very large surfaces. The basics of Hf-sputtering and the apparatus involved limit the length of the cathodes to 1 m.

The deposition of dielectric layers, which are absorption-free or near-absorption-free in the visible spectral range, by means of reactive DC-magnetron-sputtering is, however, limited since the layers to be produced often are electrically insulating and, hence, can affect the sputtering process or even cause a break down. Further, the chemical reaction for forming the dielectric layer also takes place on the target surface which then causes the desired chemical compound to be deposited on the target surface, which, in turn, can drastically change the characteristic lines of discharge of the sputtering (hysteresis) and lead to an unstable process.

The above mentioned reasons determine in practice that only a few materials in the form of oxides can be sputtered with good success by means of the reactive DC-magnetron process. This includes materials which even in the form of oxides exhibit a certain electrical conductivity such as indium oxide, tin oxide, indium-tin oxide, zinc oxide. All of the aforesaid are materials which, under favorable manufacturing conditions, exhibit significant electrical conductivity (transparent, conductive oxides). Moreover, these materials exhibit a relatively low reactivity with respect to oxygen which permits suppressing the formation of insulating layers on the cathode surface to such an extent that a continuous coating is possible.

All of the above mentioned material can be used to produce sufficiently absorption-free layers in order to achieve, by means of interference effects, simple reflection reducing effects which, are required, for example, in architecture for sun protection panes or heat insulating panes. Such layers are know from the German DE-OS 33 07 661, to which U.S. Pat. No. 4,548,691 corresponds or the EP-OS 104 870 and are manufactured in large industrial scale. It is a disadvantage that these materials which can be easily sputtered as transparent oxides have a refractive index of approximately ≧1.9; this is a significant restriction regarding optical adjustment (filter function) of layer packages since interference effects are, on the one hand, dependent on layer thickness and, on the other hand, on the refractive index of the layer used. Hence, properties which lead to a significant improvement of the function of these layers and are theoretically and in laboratory proportions possible cannot be produced since the materials required having a low refractive index cannot be produced at all or cannot cost-efficiently be produced in industrial proportions.

Especially silicon dioxide (n TM 1.45), aluminum oxide (n TM 1.7) and some fluorides (MgF n TM 1.35) are known as dielectric materials having a low refractive index. In the form of thin layers these materials—especially the oxides—can be prepared from suitable targets by means of conventional or high frequency sputtering. When used for filter or reflection reducing layers they are, thus prepared, often used for small substrate dimensions (eye glasses). It has also been suggested to sputter these materials reactively and in particular by direct voltage. Especially the oxides are of interest for the coating of large surfaces since fluorides, due to aggressiveness of the fluorine component, would require in the sputtering gas special measures against excessive corrosion of the most metallic recipients and pumps.

The above mentioned oxides include the problem that the materials in elementary form (Al, Si) exhibit an extreme reactivity regarding oxygen and, further, also form very good insulating layers. Moreover, Si poses the problem that it is practically non-conductive at room temperature and, hence, doped Si must be used as a target in order to be able to operate with DC in the first place.

In order to suppress the forming of an insulating layer on the target surface during sputtering, arrangements were suggested (DE-OS 33 31 707 and DE-OS 35 21 053) which serve to cause the chemical reaction to occur at the substrate surface. In particular, the reaction balance is shifted by disposing a geometric diaphragm and a controlled gas inlet such that suboxides are formed at the target surface which still have a sufficient residual conductivity and thus do not adversely affect the discharging process. However, a preferably transparent and stoichiometric oxide is formed at the substrate surface.

These arrangements, however, imply that a relatively large portion of the sputtered material for the formation of the layer is lost, since a significant portion of the material is deposited on the geometric diaphragms included. Furthermore, due to the diaphragm aperture as well as the more difficult process control, the latter being unstable, the rate of deposition is limited to values ranging about ⅓ of the coating rates which are achieved for the above said materials having a high refractive index. This means the devices and processes indicated can only in exceptions be economically justified.

SUMMARY OF THE INVENTION

Using known devices of reactive direct current sputtering, it is an object of the invention to provide a process for applying a thin dielectric layer having a refractive index of <1.7 and depositing the layers at a rate which is comparable to layer deposition rates of materials like tin oxide, indium oxide etc.

The object is accomplished in that the material to be sputtered (target) is a silicide, preferably nickel disilicide ($NiSi_2$), and the layer deposited on the substrate is preferably the corresponding oxide, NiSi-oxide, for example, and the reactive gas introduced into the vacuum chamber is oxygen and the process gas is a noble gas.

Advantageously, a compound is selected as a sputtering material (target) which, on the one side, is electrically conductive and, on the other side, exhibits in an oxygen-containing atmosphere only little tendency to form a dense, electrically insulating layer at the target surface and, nevertheless, reacts in sputtered form with oxygen so as to form a transparent oxide layer having the desired properties.

The value of the refractive indices of many dielectric oxides which are formed from a compound or a mixture of two different oxides is usually between the two values characteristic for the respective pure oxides. In particular, the refractive index of the mixture can be approximated according to the EFFECTIVE MEDIUM APPROXIMATION (EMA: Maxwell Garnet, *Phil. Trans.* A. 203, (1904), pp. 385–420) based on the approximation formula: $n^2_{1,2} = C_1*n^2_1 + C_2*n^2_2$. Usually, this information is used to adjust the refractive index of a layer by adjusting the composition of the material to satisfy the respective requirements. In the present case this means that an additional material component can be added (alloyed) to a pure material like Si, assuming that the refractive index of the forming mixed oxide changes in an controlled way. In particular, the refractive index is so close to that of Si that the percentage of the added additional material component is kept low. However, since the added component is for simultaneously preventing the formation of an electrically insulating layer on the target surface, a material is advantageously selected which exhibits only little tendency to form a thick oxide layer and can rather be considered a protective oxide layer. Adding such a material, however, includes the risk that during the sputtering a layer is formed at the substrate which is not entirely oxidized and consequently exhibits a significant absorption, rendering the precipitated layer useless for coating transparent substrates when the light transmission of the substrates is to be maintained.

It hence could not be predicted that oxide layers which are sputtered by means of reactive direct-current sputtering in an Ar-$O_2$ atmosphere, based on an $NiSi_2$ target, do not exhibit any significant absorption. The refractive index of the resulting mixed oxide is close to the value of silicon oxide, hence, in the desired range.

The selected Si-Ni-compound exhibits a specific resistance which is by a factor 10 less than highly-doped, polycrystalline silicon, which is a great advantage when used as a target in a direct-current sputtering process.

It is a further result that when such a compound is sputtered in an oxygen-containing atmosphere the sputtering process is significantly less hampered by the formation of an electrically insulating oxide layer on the target surface, as would be the case in a doped, polycrystalline silicon target. The sputtering characteristics of the target are more similar to a Ni-target, which forms only a relatively thin nickel oxide layer, which is no major interference during the sputtering. This can be clearly seen in the voltage-oxygen flow characteristic line of the target which is illustrated in FIG. 4 in a comparison to pure nickel and a doped Si-target. This characteristic behavior can be explained in that during the sputtering of the target, nickel builds up on the surface. The discharge characteristics of the target, which are basically determined by the electronic properties of the target surface, are caused by this nickel-containing surface layer. This is suggested by the fact that a significant deposit of Ni at the target surface can be determined when a $NiSi_2$ target is sputtered in a pure noble gas atmosphere (Sputtering by Particle Bombardment II, ed. R Behrisch, published by Springer, Berlin, 1983). However, it should be noted that the characteristic behavior of a target when sputtered in noble gas atmosphere does not in most cases, permit conclusions as to how it reacts when sputtered in a reactive medium since during this process, there are further chemical reactions taking place on the target surface in addition to the sputtering process. In most cases the resulting reaction products affect the sputtering behavior such that the latter cannot be predicted. The present sputtering behavior, however, permits operation of the target in a similar way, i.e. without especially reducing the diaphragm aperture, and in a similar arrangement as it is the case in the above said oxides having a high refractive index.

In accordance with the invention a target is composed of a minimum of 66% Si and a maximum of 90% Si, the rest being Ni. Advantageously, a composition is used which corresponds to the intermetallic Compound $NiSi_2$ (nickel-disilicide).

BRIEF DESCRIPTION OF THE DRAWING

FIG. 1 is a characteristic curve of cathode voltage as a function of oxygen flow at constant sputter current for $NiSi_2$ target.

FIG. 2 plots the refractive index as a function of wavelength or the NiSi oxide coating of FIG. 5.

FIG. 5 plots the transmission and reflection, as a function of wavelength, of a sputtered NiSi oxide coating on glass.

FIG. 6 plots the transmission as a function of wavelength for the low E coating on glass of Example 2.

DETAILED DESCRIPTION OF THE PREFERRED EMBODIMENTS

Embodiment 1

In a cathode sputtering device of type VZK 550 of the firm of Leybold AG float glasses having the dimensions 2×50×50 mm were coated with an SiNi-oxide layer sputtered in an argon-oxygen atmosphere; the target composition corresponded to the compound $NiSi_2$. A high-performance magnetron cathode type Leybold PK 75 was used as a sputtering cathode. Based on the characteristic line of discharge, i.e. the voltage behavior of the magnetron discharge at a constant current as a function of the oxygen supplied via a mass flow control, the range can be defined which is required for the desired layer composition, i.e. transparent. In FIG. 1, this range is marked in the characteristic line.

Figure 3:
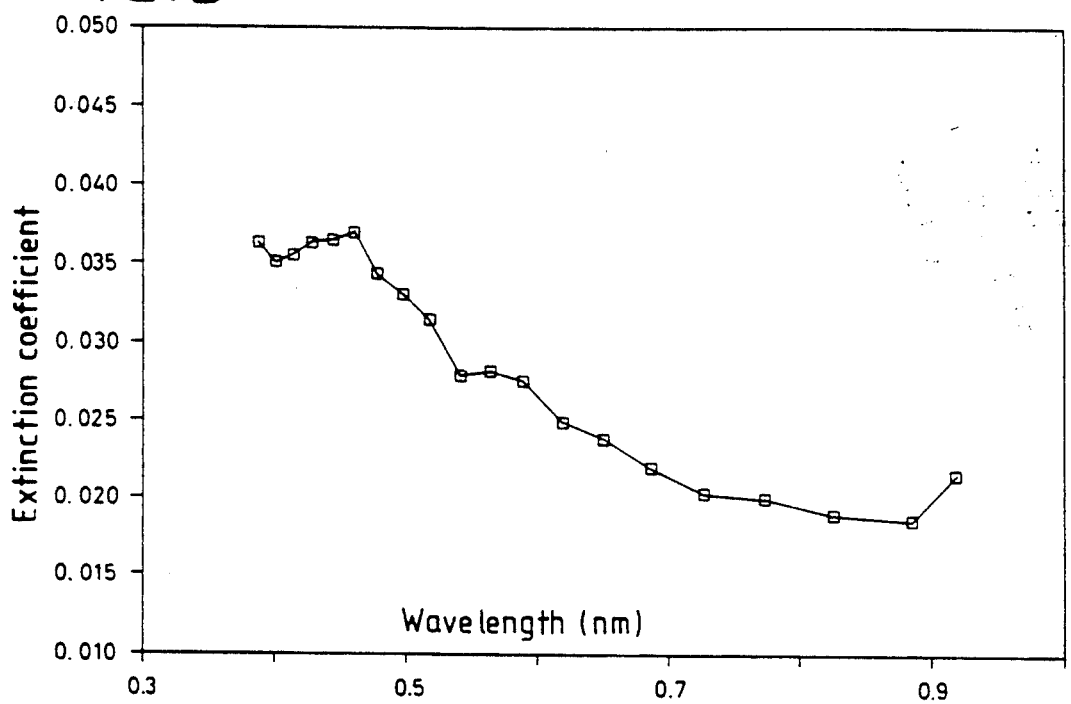
FIG. 3 plots the extinction coefficient as a function of wavelength for the coating of FIG. 5.

The transmission and the reflection of layers sputtered in the marked range were measured in the visible and close infrared range (0.3 to 2.5 μm) by means of a spectral photometer type Lambda 9 of the firm of Perkin Elmer (FIG. 5). Based on these measurements refractive index n and absorption coefficient k were determined via the visible spectral range (FIGS. 2, 3).

The transmission and reflection curves measured of selected layers are represented in FIG. 5 as are the resulting values for n and k.

The thicknesses of the layers, which were determined by means of a stylus method (Tallystep of the firm of Rank Taylor Hobson), are included in the table, together with the refractive coefficient for specific wave lengths.

Figure 4:
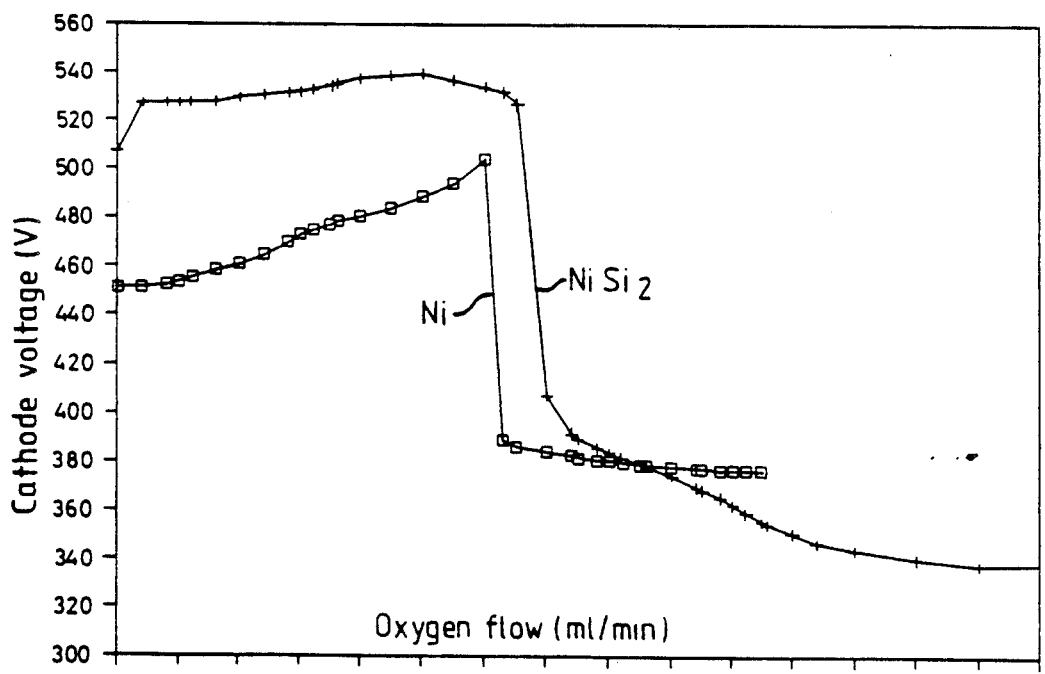
FIG. 4 plots the cathode voltage at constant current against oxygen flow for both Ni and $NiSi_2$ targets.

For a comparison, FIG. 4 shows the discharge voltage at a constant cathode current plotted against the oxygen flow introduced into the recipient for the $NiSi_2$ target used as well as for a pure Ni-target with the coating carried out in the same apparatus. It can be seen that the covering of the target surface with oxide, characterized by a steep cathode voltage drop, occurs for both targets in a similar way and at approximately the same oxygen flows. For the NiSi target the transition is even somewhat more continuous. In practice, this means that the target can still be operated in a stable way in this range, which is the preferred area of operation, as indicated in FIG. 1, for obtaining transparent films or coatings.

For achieving high coating rates it is essential that transparent layers can already be sputtered in the range of the characteristic line before complete oxidation of the target surface, i.e. before the voltage drop. As opposed to the characteristic lines indicated, a target of doped, polycrystalline silicon exhibits a totally different behavior, especially the discharge voltage rises with an increasing oxide covering of the target.

Embodiment 2

According to the process explained in U.S. Pat. No. 4,548,691, incorporated herein by reference, a layer system (Low-e) was applied to a mineral glass pane consisting of a first layer made of tin oxide which was reactively sputtered from a metallic target in an argon and oxygen atmosphere, a second thin Ag-layer sputtered in Ar-atmosphere, and (as indicated in the OS) a very thin Al-layer as a protective layer, also sputtered in Ar-atmosphere. On this layer stack, a fourth layer was applied thereon as a tin oxide layer which, however, was (as opposed to the teaching of the cited patent) only half as thick as the first tin oxide layer sputtered on the glass substrate. Subsequently, in accordance with the present invention a NiSi-oxide layer (fifth layer) also having a thickness of appr. 20 nm was applied onto this fourth layer. As can be gathered from the measured transmission curves in FIG. 6, it is possible to achieve even significantly higher transmission values than patent is possible with the layer sequence as described in the cited patent. Hence, the use of the target in accordance with the invention permits a significant improvement of the properties of known products while applying conventional methods.

Figure 7:
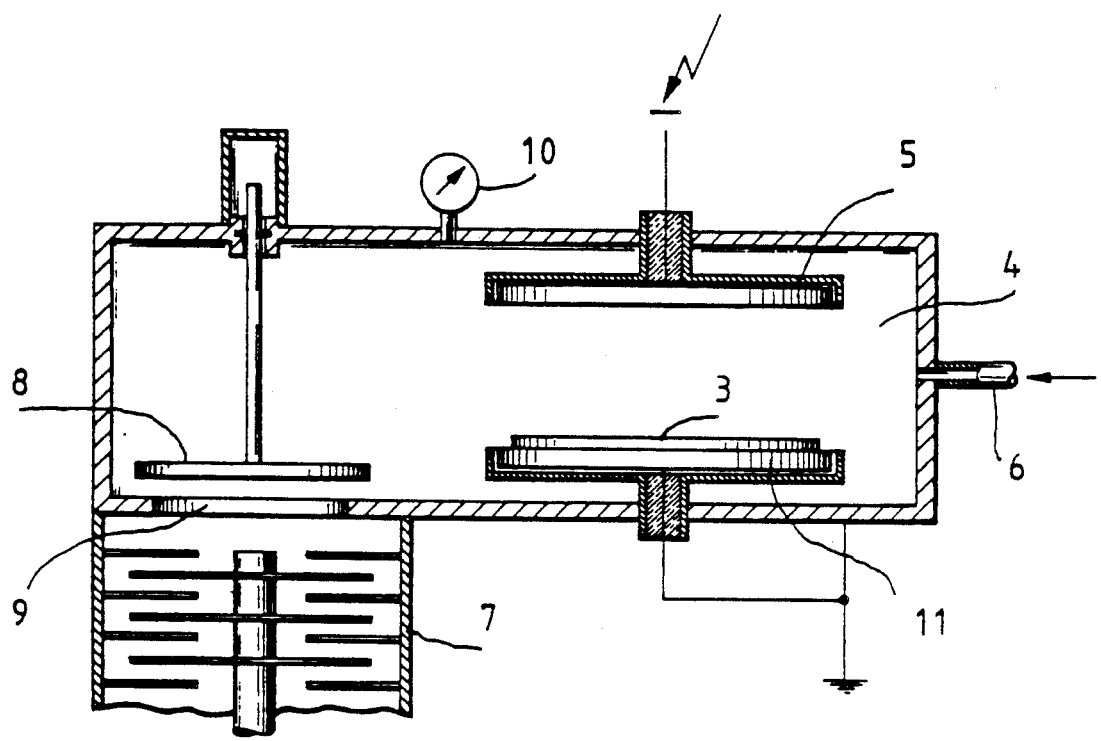
FIG. 7 is a diagrammatic representation of a system which can be used for the inventive process.

FIG. 7 diagrammatically represents in further detail a coating system which can be used for the described process. Basically, the coating system includes a vacuum chamber 4 having an inlet 6 for a process gas, a turbo pump 7 connected to the chamber 4, a valve 8 for the intake aperture 9, a target 5 supported in the chamber 4, pressure guage 10, and an anode 11 on which the substrates 3 can be positioned during sputtering.

An overview of the values obtained with the aforesaid process as compared to values which can be obtained with conventional processes is represented in the Table below.

| Material | rate A cm$^2$/(W sec) | thickness nm | refractive coefficient |
|---|---|---|---|
| SnO$_2$ | 6.0 | 50 | 2.10 |
| SiO$_2$ | 1.6 | 100 | 1.45 |
| NiSiO$_x$ | 6.6 | 100 | 1.6 |

I claim:

1. Process for coating transparent substrate with a transparent dielectric layer having a refractive index less than 1.7 and a layer growth rate greater than 6.0 A cm$^2$/W sec by means of reactive direct current cathode sputtering in a vacuum chamber into which a reactive gas and a process gas are introduced, the chamber including a cathode which is provided on one of its surfaces with the material to be sputtered and deposited on the substrate, characterized in that the material to be sputtered is a composition of 66–90 at .% silicon, balance nickel, and the layer deposited on the substrate is the corresponding oxide, and the reactive gas introduced into the vacuum chamber is oxygen and the process gas is a noble gas.

2. Process as in claim 1 wherein the material to be sputtered is nickel disilicide (NiSi$_2$) and the layer deposited on the substrate is NiSi oxide.

* * * * *